US011316006B2

(12) United States Patent
Voiron et al.

(10) Patent No.: US 11,316,006 B2
(45) Date of Patent: Apr. 26, 2022

(54) POROUS REGION STRUCTURE AND METHOD OF MANUFACTURE THEREOF

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Frédéric Voiron, Barraux (FR); Julien El Sabahy, Grenoble (FR); Guy Parat, Claix (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 24 days.

(21) Appl. No.: 17/095,202

(22) Filed: Nov. 11, 2020

(65) Prior Publication Data
US 2021/0066449 A1 Mar. 4, 2021

Related U.S. Application Data

(63) Continuation of application No. PCT/EP2019/061927, filed on May 9, 2019.

(30) Foreign Application Priority Data
May 11, 2018 (EP) .................................... 18305582

(51) Int. Cl.
*H01L 21/02* (2006.01)
*H01L 21/32* (2006.01)
(Continued)

(52) U.S. Cl.
CPC ............ *H01L 28/92* (2013.01); *C25D 11/022* (2013.01); *C25D 11/18* (2013.01);
(Continued)

(58) Field of Classification Search
CPC ............... H01L 28/92; H01L 21/02244; H01L 21/02258; H01L 21/32; C25D 11/022; C25D 11/18
(Continued)

(56) References Cited

U.S. PATENT DOCUMENTS

| 2011/0073827 A1 | 3/2011 | Rubloff et al. |
| 2012/0132529 A1 | 5/2012 | Zekry et al. |

(Continued)

FOREIGN PATENT DOCUMENTS

| EP | 3556910 A1 | 10/2019 |
| WO | 2015063240 A1 | 5/2015 |

OTHER PUBLICATIONS

International Search Report issued for PCT/EP2019/061927, dated Jul. 22, 2019.
(Continued)

*Primary Examiner* — David Vu
*Assistant Examiner* — Brandon C Fox
(74) *Attorney, Agent, or Firm* — ArentFox Schiff LLP

(57) ABSTRACT

A porous region structure and a method of fabrication thereof are disclosed. The porous region structure is characterized by having a hard mask interface region with non-uniform pores sealed and thereby excluded functionally from the structure. The sealing of the hard mask interface region is done using a hard mask deposited on top of an anodization hard mask used to define the porous region of the structure. By excluding the hard mask interface region, the porosity ratio and the equivalent specific surface of the porous region structure can be controlled or quantified with
(Continued)

higher accuracy. Corrosion due to exposure of an underlying metal layer of the structure is also significantly reduced by sealing the hard mask interface region.

16 Claims, 4 Drawing Sheets

(51) Int. Cl.
    *C25D 11/18*     (2006.01)
    *H01L 49/02*     (2006.01)
    *C25D 11/02*     (2006.01)

(52) U.S. Cl.
    CPC .. H01L 21/02244 (2013.01); H01L 21/02258 (2013.01); *H01L 21/32* (2013.01)

(58) Field of Classification Search
    USPC ........................................................ 257/534
    See application file for complete search history.

(56) References Cited

U.S. PATENT DOCUMENTS

| | | |
|---|---|---|
| 2014/0140054 A1 | 5/2014 | Hashimura et al. |
| 2015/0090597 A1* | 4/2015 | Tatebe ................... C25D 11/12 205/50 |
| 2016/0268144 A1 | 9/2016 | Voiron et al. |
| 2019/0062939 A1* | 2/2019 | Curran ................. C25D 11/246 |
| 2019/0376202 A1* | 12/2019 | He .......................... C25D 11/18 |
| 2021/0032766 A1 | 2/2021 | Voiron et al. |
| 2021/0280670 A1* | 9/2021 | El Sabahy ............. H01G 4/008 |

OTHER PUBLICATIONS

Written Opinion of the international Searching Authority issued for PCT/EP2019/061927, dated Jul. 22, 2019.

Zhao, X. et al.; "Patterned anodic aluminium oxide fabricated with a Ta mask"; Nanotechnology 17 (2006). pp. 35-39.

Banerjee, P. et al.; "Nanotubular metal-insutator-metal capacitor arrays for energy storage"; Nature Nanotechnology, vol. 4, May 2009. pp. 292-296.

Zhao, X. et al.; "Anodizing Behavior of Aluminum Foil Patterned with $SiO_2$ Mask"; Journal of The Electrochemical Society 152 (10) (2005), pp. B411-B414.

European Patent Office Communication dated Oct. 26, 2021 and issued for EP 18 305 582.1.

* cited by examiner

POROUS REGION STRUCTURE AND METHOD OF MANUFACTURE THEREOF

CROSS REFERENCE TO RELATED APPLICATIONS

The present application is a continuation of International application No. PCT/EP2019/061927, filed May 9, 2019, which claims priority to European Patent Application No. 18305582.1, filed May 11, 2018, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PAA) for example. The successive layers of metal, insulator, and then metal follow the contours of the porous material resulting in the MIM structure being embedded inside the pores of the porous material. Banerjee's PAA embedded structure however suffers from high Equivalent Series Resistance (ESR) and limited capacitance density due to the PAA thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from embedding a structure (e.g., a MIM capacitive stack) inside a porous region above a substrate, such as a silicon wafer. Typically, the porous region results from anodizing a thin layer of metal, such as aluminum, deposited above the substrate. The anodization converts the aluminum layer into porous anodic alumina. Typically, the porous region is formed with any shape (as viewed from the top) and extends across the alumina layer in a direction perpendicular to the wafer surface.

FIG. 1 is a cross-section view of an example structure 100 used in fabricating a product having a porous region. Example structure 100 may be for example an intermediate product in the process of fabricating an integrated capacitor structure as described in WO 2015/063420 A1. Example structure 100 is provided for the purpose of illustrating the formation of the porous region and is not limiting with respect to the types of products that may be generated.

As shown in FIG. 1, structure 100 includes a silicon layer 102, an aluminum layer 104, a barrier layer 106, an aluminum layer 108, and a hard mask layer 110. In an example product, aluminum layer 104 may provide an electrode for an integrated capacitor structure. Barrier layer 106 may provide protection to aluminum layer 104, e.g., by stopping the progression of anodization from reaching aluminum layer 104 and/or in a subsequent PAA etching step of the fabrication process.

In forming the porous region, it may be desirable for some applications to have the resulting porous region embedded within the original aluminum layer. For example, it may be desirable to control the size of the resulting porous region in order to control the size and electrical value (e.g., capacitance, resistance, etc.) of the structure that will be embedded therein. Typically, this is done by applying hard mask layer 110 on top of aluminum layer 108 to mask the area of aluminum layer 108 that is not intended to be anodized. The masking shields this area from contact with the anodization electrolyte, and the porous region is thus formed in the area(s) of aluminum layer 108 where hard mask layer 110 is open.

FIG. 2 is a scanning electron microscopy (SEM) image illustrating a top view of the interface between a hard mask (HM1) and a porous region (PAA) formed using the above-described anodization process. As shown, the hard mask HM1 is formed in such a way to define the perimeter and location of the porous region PAA within the original embedding metal (e.g., aluminum) layer.

Typically, a silicon dioxide masking layer is used for the hard mask HM1. This choice is driven by several factors, including the availability of a silicon dioxide deposition process at medium/low temperature that is compatible with deposition above an aluminum based stack, the availability of silicon dioxide patterning techniques with good selectivity on an underlying aluminum layer, the resistance of silicon dioxide to the anodization step, and the relatively low stress induced by an oxide layer.

However, while this choice is beneficial for the reasons above, it has an undesirable effect on pore formation in the region of the aluminum layer adjacent to the hard mask (hereinafter "hard mask interface region"). Essentially, the use of silicon dioxide for the hard mask layer weakens the anodization electrical field through the underlying aluminum layer near the hard mask interface. This weakening of the anodization electrical field results in pores being not fully open and/or malformed in the hard mask interface region.

FIG. 3 is an SEM image of a cross-section which illustrates the hard mask interface region of an example porous region formed using a silicon dioxide hard mask over an aluminum layer. As shown in FIG. 3, the pores in the hard mask interface region (hereinafter "lateral pores") are highly non-uniform, with uneven diameters and/or depths. Further, rather than extending perpendicularly or substantially perpendicularly toward the substrate, the lateral pores tend to curve away from the substrate so as to penetrate into the sides of the embedding aluminum layer.

The extent of depth non-uniformity of the lateral pores depends on the density of aluminum grain boundaries (and other microstructure parameters) but primarily on the anodization electrical field distribution. Closer to the hard mask edge, where the anodization electrical field is weakest, the lateral pores stop in a residual aluminum ledge. The width of this aluminum ledge, in the direction parallel to the substrate surface, may be reduced by control of the anodization process, but this control is limited by the risk of oxidation of an anodization stop layer underlying the aluminum layer. Further from the hard mask edge, where the anodization electrical field is stronger, the aluminum ledge gradually diminishes and gets replaced with alumina. Lateral pores in this area may extend all the way through the aluminum layer. In one implementation, the pores may open onto a bottom metallic layer that is laid under the aluminum layer to enable electrical contact with the structure embedded in the porous region. However, while fully open, the lateral pores in this area may still be malformed with high probability.

In practice, as the inventors of the present invention have been able to determine, the width of the hard mask interface region is correlated l to the thickness of the aluminum layer being anodized (the thicker is the aluminum layer, the wider is the hard mask interface region). For example, for a porous region resulting from a typical 60V anodization process, the hard mask interface region may include a malformed area that is approximately 10 microns wide for a 5 microns deep PAA structure or 20 microns wide for a 10 microns deep PAA structure. The width of the residual aluminum ledge near the hard mask edge, while controllable by the anodization process, is typically adjusted between 5 and 20 microns. The hard mask interface region may thus be significant in size, particularly for smaller size porous regions.

Because the hard mask interface region may be uncontrollable in terms of pore shape (i.e., depth, diameter, orthogonality to the substrate), the contribution of the hard mask interface region to the porosity ratio (i.e., the fraction of air/vacuum in the porous region) of the porous region, and correspondingly to the electrical value (e.g., capacitance, resistance, etc.) of a structure embedded in the porous region, may be difficult to quantify with high accuracy. This may be problematic where a precise specific area (where the specific area is defined as the ratio of 3D to 2D exposed surface, with the 3D exposed surface including the surface area of the pores and the 2D exposed surface being the top surface of the porous region) is required. For example, in the case where a capacitive structure is embedded into the porous region, a variation tolerance lower than 1% of the nominal capacitance may be required. For a capacitor embedded in a small porous region (e.g., <0.5 mm$^2$), the hard mask interface region may contribute approximately 4% of the porous region's volume. Thus, geometric fluctuations within the hard mask interface region may cause the error in the actual structure capacitance to exceed the variation tolerance. The uncontrollability of the lateral pores may also be problematic where the pore shape (depth, diameter, orthogonality to the substrate) of the porous region structure needs to be well controlled for certain applications.

The lateral pores may also be prone to inducing corrosion into the resulting product. In one implementation, the pore formation process is followed by a pore enlargement process in which the PAA walls between pores ("inter-pore walls") are wet etched (e.g., using phosphoric acid) to enlarge pore diameters and, correspondingly, the surface area embedded in the pores. A large part of the inter-pore walls may be etched away by this step and layers underlying the pore bottoms may be exposed. For non-lateral pores (i.e., pores outside the hard mask interface region and which extend perpendicularly or substantially perpendicularly toward the substrate), an underlying barrier layer made of a metal such as tungsten (W) or titanium (Ti) may be exposed. Lateral pores may extend into the sides of the embedding aluminum as discussed above, leading to aluminum being exposed.

The exposure of the aluminum may cause corrosion during the barrier etching (phosphoric acid etch is non selective on Al) or in a subsequent process step. For example, in the case that a capacitive MIM structure is deposited into the porous region, an electrode of the MIM structure may be formed of titanium nitride (TiN) typically deposed by an Atomic Layer Deposition (ALD) process with a gaseous halogen-based (e.g., chlorine) precursor. The exposure of aluminum to this precursor leads to its corrosion and the growth of AlClO compounds that can result in catastrophic failures or short term reliability issues. SEM images of a cross-section and a surface-tilted view respectively of an example porous region showing corrosion resulting from aluminum exposure are provided in FIGS. 4A and 4B. It is noted that the barrier layer (made of W or Ti, for example) underlying the non-lateral pores of the porous region is less prone to halogen corrosion than aluminum. Exposure of this layer to the halogen-based precursor does not create a risk of catastrophic corrosion in the resulting product.

The present invention has been made in the light of the above problems.

SUMMARY OF THE INVENTION

The present invention provides a method of fabricating a porous region structure, comprising:
depositing a first metal layer above a substrate;
depositing an anodization hard mask on top of the first metal layer, the anodization hard mask having an opening above an anodization area of the first metal layer;
anodizing the first metal layer to form a porous region within the first metal layer, the porous region underlying the anodization area of the first metal layer;
depositing a hard mask on top of the porous region, the hard mask having an opening above a defined area of the porous region, the defined area being smaller than and comprised within the anodization area; and
depositing a layered structure on top of the hard mask and the porous region, to embed the layered structure into the porous region over the defined area of the porous region.

In an embodiment, the porous region formed by the anodization of the first metal layer comprises an anodic oxide having a plurality of pores that extend from a top surface of the porous region toward the substrate. In the region of the first metal layer adjacent to the anodization hard mask ("hard mask interface region") however, pores may be highly non-uniform. Specifically, the pores in this region ("lateral pores") may have uneven diameters and/or depths. Further, rather than extending perpendicularly or substantially perpendicularly toward the substrate, the lateral pores tend to curve away from the substrate so as to penetrate into the sides of the first metal layer embedding the porous region. As a consequence, when the layered structure is deposited, the electrical contribution (e.g., capacitance, resistance, etc.) of these lateral pores can be difficult to quantify with precision. Further, the lateral pores may be prone to inducing halogen corrosion into the resulting product when a subsequent process step uses a halogen-based precursor.

The deposition, on top of the anodization hard mask, of a hard mask having a smaller opening above the porous region than the anodization hard mask ensures that the lateral pores of the porous region are sealed by the hard mask when the layered structure is deposited. Because the lateral pores are eliminated from the resulting porous region embedded structure, the precision of the electrical value (e.g., capacitance, resistance, etc.) of the structure can be improved. Further, the porosity ratio (i.e., the fraction of air/vacuum in the porous region) and the pore shape (i.e., depth, diameter, orthogonality to the substrate) of the structure can be better controlled. Sealing the lateral pores also significantly reduces the risk of halogen corrosion occurring in the first metal layer due to a subsequent process step using a halogen-based precursor.

In another embodiment, the fabrication method may further include selectively etching the anodization hard mask prior to depositing the hard mask. The partial or complete removal of the anodization hard mask prior to depositing the hard mask can have several benefits. For example, during the anodization, the anodization hard mask may crack at the edges of the porous region due to the expansion of the PAA. The removal of the anodization hard mask allows any cracked areas of the anodization hard mask to be removed, making for a better deposition of the hard mask. The resulting structure is improved both from a cosmetic as well as from a robustness point of view (potential for chipping of the anodization hard mask is reduced or eliminated in the case the anodization hard mask is removed entirely). Subsequent process steps (e.g., metallization or photo-resist spin coating) are also simplified by the removal of the anodization hard mask.

In porous region structures formed according to the above method, the lateral pores fall within the anodization area but outside the defined area of the porous region. In an embodiment, a distance between an edge of the anodization area and a corresponding edge of the defined area is made proportional to a thickness of the first metal layer that is anodized to form the porous region. This configuration is based on the inventors' insight that the width of the hard mask interface region increases with the thickness of the first metal layer being anodized.

In an embodiment, the hard mask is made of a material that is substantially resistant to halogen corrosion. This further protects the resulting structure from the corrosion that may be caused by the use of a halogen-based precursor in a subsequent process step. In another embodiment, the hard mask is also substantially resistant to the wet (e.g., phosphoric acid) or dry chemistry that may be used in the pore enlargement process described above and during an etching of the barrier layer at the bottom of the pores.

In an embodiment, the method of fabricating a porous region structure may further comprise depositing a second metal layer above the substrate such that the second metal layer is below the first metal layer. The second metal layer may serve to provide electrical contact to a conductive layer of the layered structure. As such, the non-lateral pores of the porous region may be configured to extend through the porous region to open onto the second metal layer. The second metal layer may be made of a metal that is resistant to halogen corrosion, thus being compatible with a subsequent process step using a halogen-based precursor.

The present invention also provides a porous region structure which may be formed using steps of the method described above. In an embodiment, the porous region structure comprises:
  a substrate;
  a first metal layer above the substrate;
  a porous region constituted by an anodized section of the first metal layer, the porous region comprising an anodic oxide having a plurality of pores that extend from a top surface of the porous region toward the substrate; and
  a hard mask above the first metal layer and the porous region, the hard mask having an opening above a defined area of the porous region configured so that the hard mask covers lateral pores of the plurality of pores of the porous region.

By sealing the lateral pores for subsequent process steps, the porosity ratio and the pore shape of the structure can be better controlled. Further, the precision of the electrical value of a device using the formed structure can be improved. Additionally, the potential of corrosion in the device due to the use of a halogen-based precursor during process steps is reduced.

In an embodiment, the porous region structure further comprises an anodization hard mask on top of the first metal layer having an opening above an anodization area of the porous region, wherein a distance between an edge of the anodization area and a corresponding edge of the defined area of the porous region is proportional to a thickness of the section of the first metal layer that is anodized to form the porous region. This configuration is based on the inventors' insight that the width of the hard mask interface region increases with the thickness of the first metal layer being anodized. In one embodiment, the distance between the edge of the anodization area and the corresponding edge of the defined area ranges from 100 nanometers to 50 microns. In an embodiment, the lateral pores fall within the anodization area but outside the defined area of the porous region.

In an embodiment, the hard mask is made of a material that is substantially resistant to halogen corrosion. This further protects the structure from the corrosion that may be caused by the use of a halogen-based precursor in a process step.

In an embodiment, the porous region structure may further comprise a layered structure deposited on top of the hard mask, the layered structure being embedded in the plurality of pores, not including the lateral pores, of the porous region. The layered structure may comprise a metal-insulator-metal (MIM) stack, resulting in the porous region structure providing a capacitive component.

In an embodiment, the porous region structure may further comprise a second metal layer below the first metal layer, wherein non-lateral pores of the plurality of pores extend through the porous region to open onto the second metal layer. The second metal layer may serve to provide electrical contact to a structure deposited into the non-lateral pores of the porous region. For example, where a layered structure is deposited into the non-lateral pores, a conductive layer of the layered structure may be in electrical contact with the second metal through the non-lateral pores. The second metal layer may be made of a metal that is resistant to halogen corrosion, thus being compatible with a process step using a halogen-based precursor.

As noted above, in embodiments, the anodization hard mask may be partially or completely removed (e.g., using selective etching) prior to the deposition of the hard mask. Removal of the anodization hard mask can have several benefits. For example, during the anodization, the anodization hard mask may crack at the edges of the porous region due to the expansion of the PAA. The removal of the anodization hard mask allows any cracked areas of the anodization hard mask to be removed, making for a better deposition of the hard mask. The resulting structure is improved both from a cosmetic as well as from a robustness point of view (potential for chipping of the anodization hard mask is reduced or eliminated in the case the anodization hard mask is removed entirely). Subsequent process steps (e.g., metallization or photo-resist spin coating) are also simplified by the removal of the anodization hard mask. Indeed, during the anodization, the edges of the anodization hard mask are pushed upwards by the expanding PAA. This creates a vertical topology that may reach several microns compared to the flat reference surface. The vertical topology also typically has a ledge toward the PAA side. This complicates subsequent process steps (including deposition of the hard mask) whenever the subsequent process steps need to cover the ledge such as to preserve for example the continuity of the deposited layer across the ledge. Removal of the anodization hard mask eliminates this vertical topology and the ledge, reducing the constraint in terms of step-coverage and the risk of having discontinuous layers.

In an embodiment, the porous region structure may further comprise an electronic component, formed on the substrate, electrically connected to the second metal layer. A device formed within the porous region may thus be connected with another electrical component on the substrate, resulting in a functional module.

In an embodiment, the substrate may be made of silicon, glass, or a polymer. The substrate may be a raw substrate (i.e., unprocessed) or processed with other electronic components formed thereon.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention address the existing deficiencies of the prior art by using a hard mask to seal the hard mask interface region of a porous region. The sealing of the hard mask interface region means that the porosity ratio (i.e., the fraction of air/vacuum in the porous region) and the equivalent specific surface of the useable portion of the porous region (i.e., the surface area provided by the unsealed pores of the porous region) can be more precisely quantified. As a consequence, when a structure is embedded into the porous region, the electrical value (e.g., capacitance, resistance, etc.) of the structure can be defined with high accuracy.

The sealing of the hard mask interface region also renders the porous region, with its embedded structure, less prone to corrosion in its underlying metal layer. In an embodiment, the structure is rendered better compatible with subsequent processes using a halogen-based precursor or processes that could cause corrosion to exposed areas of the underlying metal layer.

In accordance with these features, a method of fabricating a porous region structure according to an embodiment of the present invention is described with reference to FIGS. 5A to 5C. In an embodiment, the porous region structure may include a high-density integrated capacitor structure.

Figure 1:
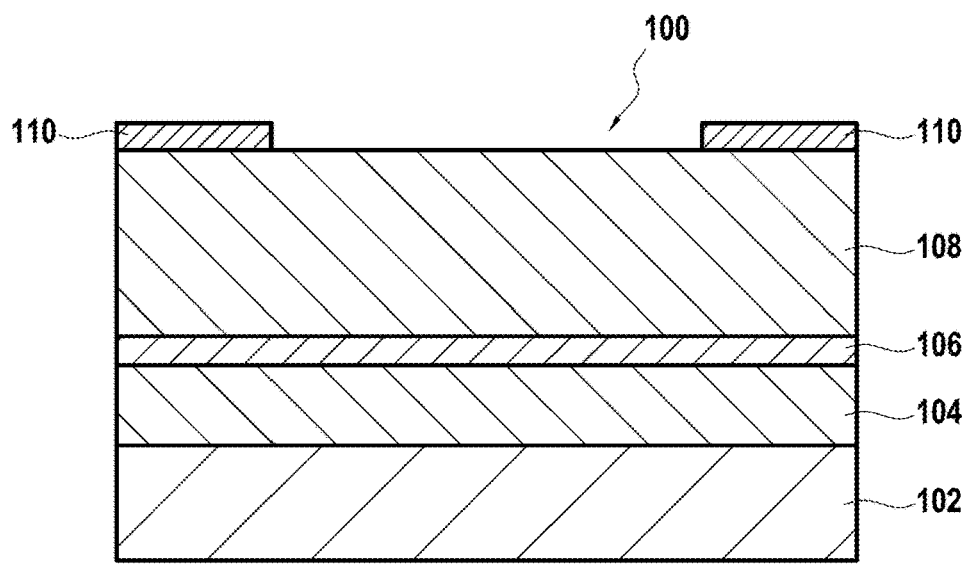
FIG. 1 is a cross-section view of an example structure used in fabricating a product having a porous region.
Figure 2:
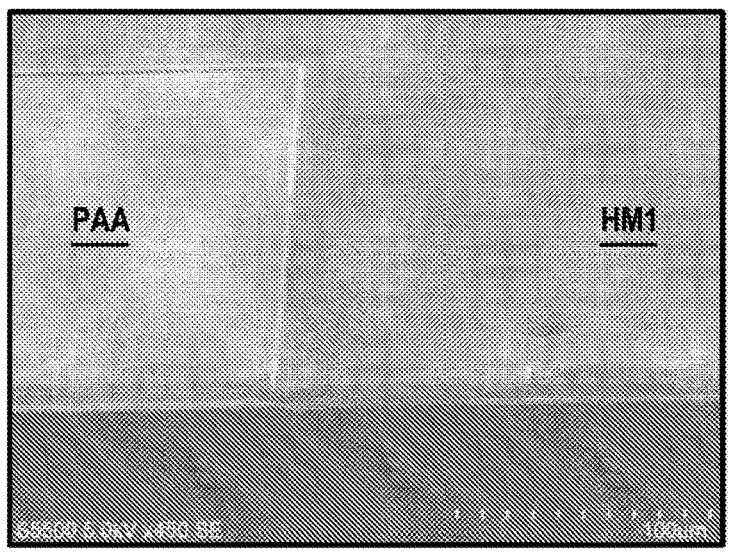
FIG. 2 is a scanning electron microscopy (SEM) image illustrating the interface between a hard mask and a porous region in a porous region structure.
Figure 3:
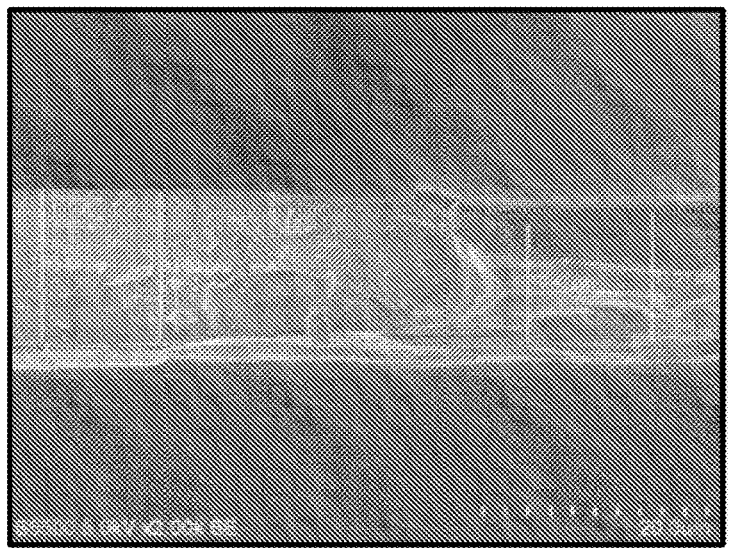
FIG. 3 is an SEM image of a cross-section illustrating the hard mask interface region of an example porous region.
Figure 4A:
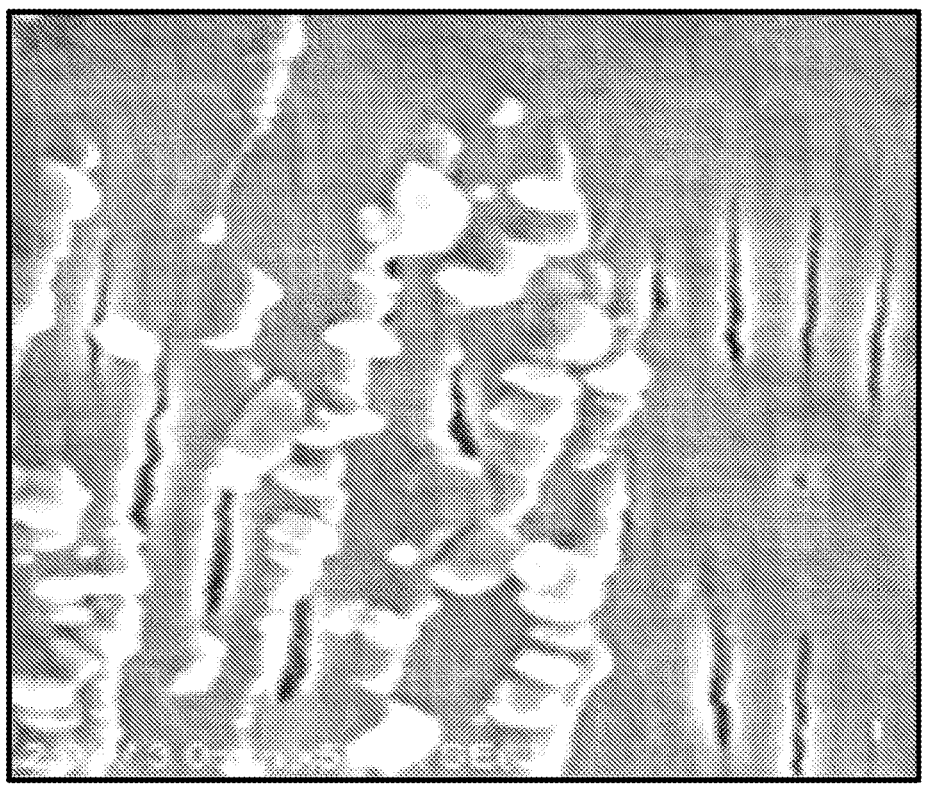
FIGS. 4A and 4B are SEM images illustrating corrosion in an example porous region structure.
Figure 4B:
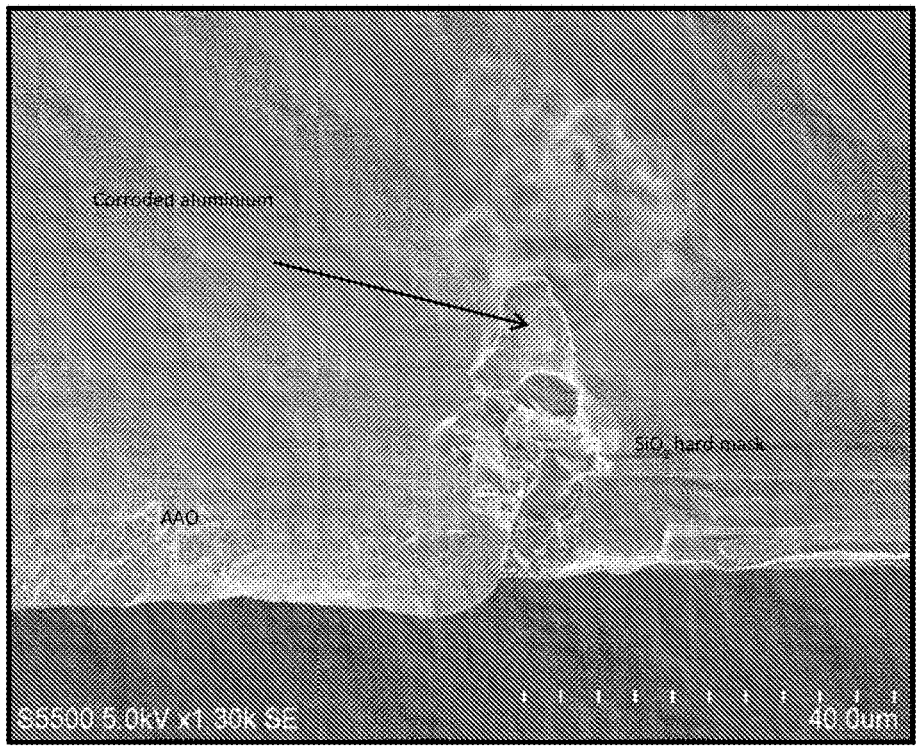
Figure 5A:
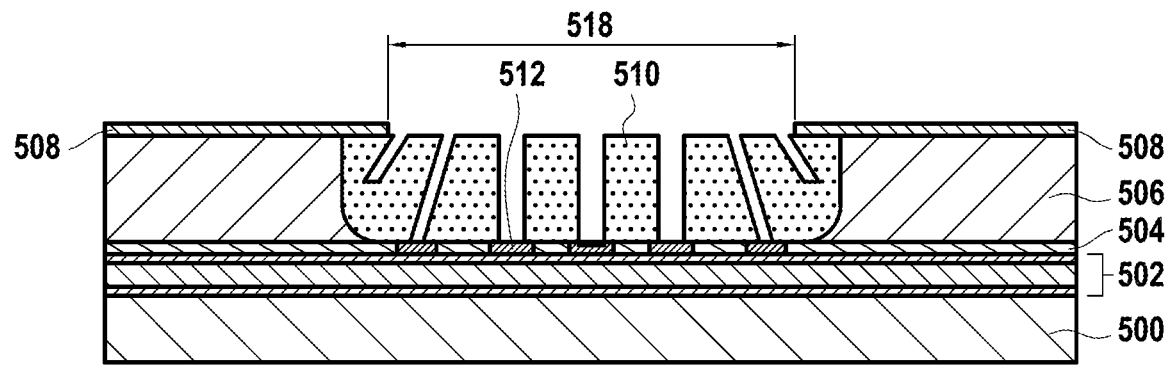
FIGS. 5A to 5C illustrate stages in an example method of manufacturing a porous region structure according to an embodiment.
Figure 5B:
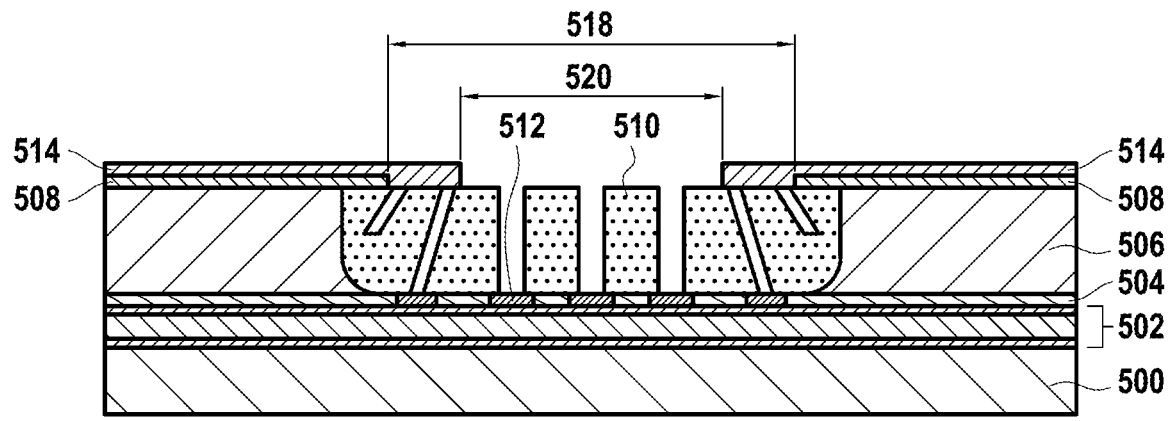
Figure 5C:
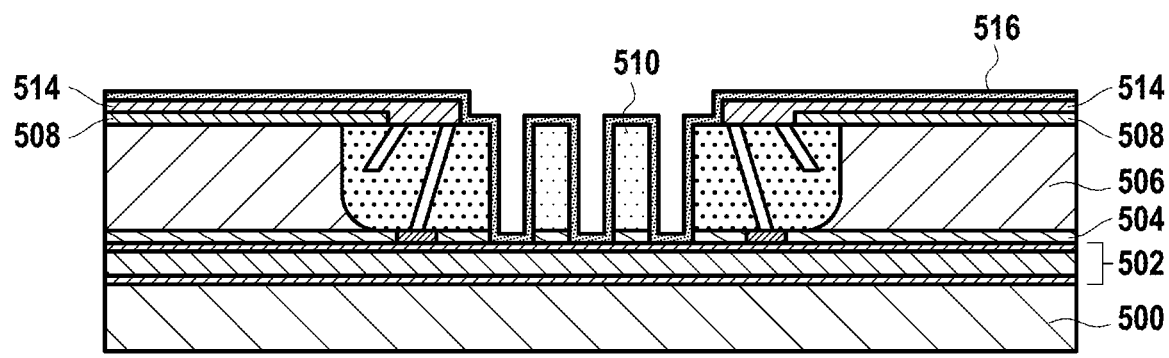

The fabrication method may include, as shown in FIG. 5A, depositing a first metal layer 506 above a substrate 500; depositing an anodization hard mask 508 on top of the first metal layer 506 with the anodization hard mask 508 having an opening above an anodization area 518 of the first metal layer 506; and anodizing the first metal layer 506 to form a porous region 510 within the first metal layer 506 underlying the anodization area 518 of the first metal layer 506.

The substrate 500 may be made, without limitation, of silicon, glass, or a polymer, and may be a raw (i.e., unprocessed) substrate or processed with other electronic components formed thereon.

The first metal layer 506 may be made of a metal such as aluminum for example. The first metal layer 506 may be formed directly on top of the substrate 500. In another embodiment, the porous region structure may include in the porous region a structure requiring a bottom electrical contact. As such, as shown in FIG. 5A, the first metal layer 506 may be formed above an electrode layer 502. The electrode layer 502 may include one or more metal layers including aluminum, copper (Cu), silver (Ag), or aluminum copper (AlCu) combined or not with barrier metals such as titanium (Ti), titanium nitride (TiN), tantalum (Ta), and tantalum nitride (TaN). In one implementation, the electrode layer 502 is formed of an AlCu layer sandwiched between two TiN or TiTiN layers.

In an embodiment, to protect the electrode layer 502 during formation of the porous region 510, a second metal layer 504 may be provided between the first metal layer 506 and the electrode layer 502. The second metal layer 504 may be selected to act as an anodization stop layer for stopping the progression of anodization from reaching the electrode layer 502. In an embodiment, during the anodization, the second metal layer 504 may oxidize to form oxide plugs 512 at the bottom of those pores reaching the second metal layer 504. The oxide plugs 512 may be etched away during a subsequent process step to allow electrical contact between the structure deposited into the pores and the electrode layer 502.

In another embodiment, the second metal layer 504 may also be selected to serve as a barrier layer for shielding the electrode layer 502 from exposure to a halogen-based precursor that may be used in a subsequent process step. As such, the second metal layer 504 may be made of a metal that is resistant to halogen corrosion, such as W or Ti, for example.

The porous region 510 comprises an anodic oxide having a plurality of pores that extend from a top surface of the porous region 510 toward the substrate 500. As used herein, the term "anodic oxide" is a generic term referring to a material including anodic oxide or hydroxide, and possibly carbon and hydrogen byproducts resulting from the anodization. Typically, as shown in FIG. 5A, the central ("non-lateral") pores extend perpendicularly or substantially perpendicularly to the substrate 500. In an embodiment, the non-lateral pores extend through the porous region 510 to open onto the second metal layer 504. Lateral pores, i.e., those falling within a hard mask interface region comprising regions of the first metal layer 506 that are adjacent to the anodization hard mask 508, however, tend to curve away from the substrate the closer they are to the edge of the anodization hard mask 508. In addition, the lateral pores may have uneven depths and/or diameters.

As discussed above, because the hard mask interface region may be uncontrollable in terms of pore shape (i.e., depth, diameter, orthogonality to the substrate), the contribution of the hard mask interface region to the porosity ratio (i.e., the fraction of air/vacuum in the porous region) of the porous region, and correspondingly to the electrical value (e.g., capacitance, resistance, etc.) of a structure embedded in the porous region, may be difficult to define with high accuracy. This may be problematic where a precise specific area is required. The lateral pores of the hard mask interface region may also be prone to inducing corrosion into the resulting product if exposed to a halogen-based precursor used for depositing the structure into the porous region.

To overcome these problems, in embodiments of the invention, the hard mask interface region is excluded from the portion of the porous region hosting the embedded structure in its pores. In an embodiment, the hard mask interface region is sealed before the structure is deposited into the porous region. In one implementation, as shown in FIG. 5B, this is accomplished by depositing a hard mask 514 on top of the anodization hard mask 508 and the porous region 510, with the hard mask 514 having an opening above a defined area 520 of the porous region 510, the defined area 520 being smaller than and comprised within the anodization area 518. In an embodiment, the defined area 520 is designed so that the hard mask 514 covers the hard mask interface region of the porous region 510.

Figure 6:
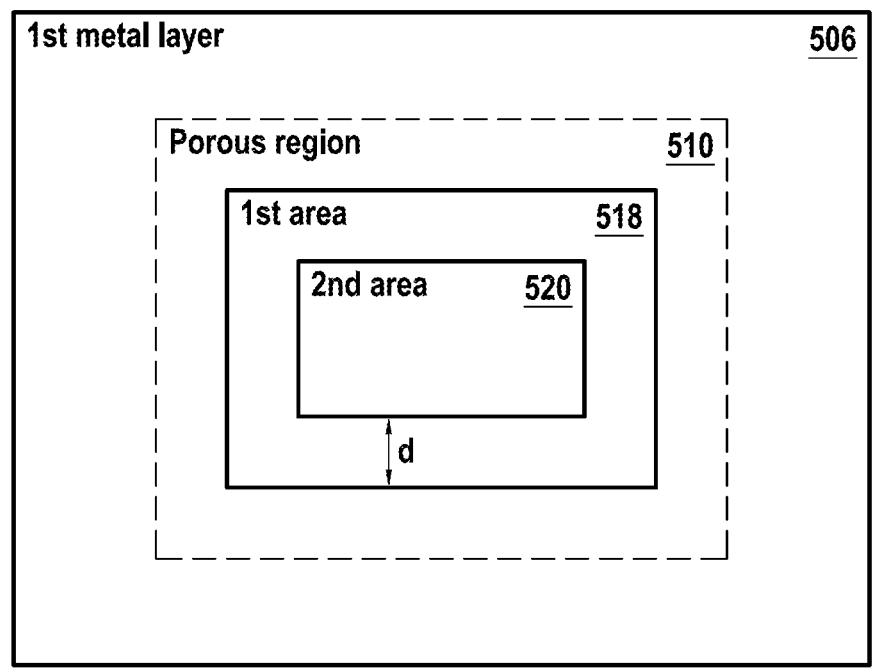
FIG. 6 is a top view of an example porous region structure according to an embodiment.

A top view illustration showing the anodization area 518 (denoted as $1^{st}$ area) and the defined area 520 (denoted as $2^{nd}$ area) relative to the porous region 510 according to an example embodiment is provided in FIG. 6. This example is provided for the purpose of illustration only and is not limiting to embodiments. As would be understood by a person of skill in the art based on the teachings herein, the perimeters of the anodization area 518 and the defined area 520 are not limited to being rectangular and may be of any shape (e.g., circular, oval, etc.).

The inventors of the present invention have recognized that the width of the hard mask interface region is proportional to the thickness of the first metal layer 506 being anodized (the thicker is the first metal layer 506, the wider is the hard mask interface region). For example, for a porous region resulting from a typical 60V anodization process, the hard mask interface region may include an area with malformed pores that is approximately 10 microns wide for a 5 microns deep PAA structure or 20 microns wide for a 10 microns deep PAA structure. In addition, the hard mask interface region typically encompasses an area in which a residual ledge of the first metal layer 506 is present. As discussed above, this ledge, while controllable by the anodization process, is typically adjusted between 5 and 20 microns. The two areas may or may not overlap in implementation.

Based on this insight, in an embodiment, a distance "d" (see FIG. 6) between an edge of the anodization area 518 and a corresponding edge of the defined area 520 is configured to be proportional to the thickness of the section of the first metal layer 506 that is anodized to form the porous region 510. In example embodiments, the distance "d" may range from 100 nanometers to 50 microns.

In another embodiment, the anodization hard mask 508 is partially or completely removed (e.g., using selective etching) before the hard mask 514 is deposited. Removal of the anodization hard mask 508 can have several benefits. For example, during the anodization, the anodization hard mask 508 may crack at the edges of the porous region 510 due to the expansion of the PAA. The removal of the anodization hard mask 508 allows any cracked areas of the anodization hard mask 508 to be removed, making for a better deposition of the hard mask 514. The resulting structure is improved both from a cosmetic as well as from a robustness point of view (potential for chipping of the anodization hard mask is reduced or eliminated in the case the anodization hard mask is removed entirely). Subsequent process steps (e.g., metallization or photo-resist spin coating) are also simplified by the removal of the anodization hard mask 508. Indeed, during the anodization, the edges of the anodization hard mask 508 are pushed upwards by the expanding PAA. This creates a vertical topology that may reach several microns compared to the flat reference surface. The vertical topology also typically has a ledge toward the PAA side. This complicates subsequent process steps (including deposition of the hard mask) whenever the subsequent process steps need to cover the ledge such as to preserve for example the continuity of the deposited layer across the ledge. Removal of the anodization hard mask 508 eliminates this vertical topology and the ledge, reducing the constraint in terms of step-coverage and the risk of having discontinuous layers.

After sealing the hard mask interface region using the hard mask 514, the method may subsequently include depositing a structure 516 on top of the hard mask 514 and the porous region 510. Because the porous region 510 is exposed only in the defined area 520, the structure 516 is embedded into the porous region 510 over the defined area 520 only.

Because the lateral pores do not contribute to the resulting structure 516, the precision of the electrical value (e.g., capacitance, resistance, etc.) of the structure 516 is improved. Further, the porosity ratio (i.e., the fraction of air/vacuum in the porous region) and the pore shape (i.e., depth, diameter, orthogonality to the substrate) of the structure 516 can be better controlled.

In an embodiment, the structure 516 may be a layered structure comprising multiple layers. The layered structure may include a conductive layer that is in electrical contact with the second metal layer 504 through the non-lateral pores. In one embodiment, the layered structure is a metal-insulator-metal (MIM) stack or a double-MIM stack, resulting in a capacitive component in the porous region structure.

In one implementation, the conductive layer, which may provide an electrode for the layered structure, may be deposited using an Atomic Layer Deposition (ALD) process with a gaseous halogen-based (e.g., chlorine) precursor. For example, the conductive layer may be made of titanium nitride (TiN). As discussed above, the exposure of the first metal layer 506, which may be made of aluminum, to this halogen-based precursor may lead to its corrosion resulting in catastrophic failures or short term reliability issues. As the lateral pores of the porous region are most prone to induce this type of corrosion, sealing the hard mask interface region using the hard mask 514 significantly reduces the risk of halogen corrosion occurring in the resulting porous region structure. In an embodiment, the hard mask 514 is also made of a material that is substantially resistant to halogen corrosion to provide further protection against this type of corrosion.

In accordance with the above discussed features, the present invention also provides a porous region structure. The porous region structure may be fabricated using steps of the method described above and may include any of the structures shown in FIGS. 5B and 5C. In an embodiment, the porous region structure comprises:

a substrate;

a first metal layer above the substrate;

a porous region constituted by an anodized section of the first metal layer, the porous region comprising an anodic oxide having a plurality of pores that extend from a top surface of the porous region toward the substrate; and a hard mask above the first metal layer and the porous region, the hard mask having an opening above a defined area of the porous region configured so that the hard mask covers lateral pores of the plurality of pores of the porous region.

In an embodiment, an anodization hard mask is used to form the porous region. Specifically, the anodization hard mask is deposited on top of the first metal layer with an opening above an anodization area of the first metal layer, the anodization area corresponding to the section to be anodized. In an embodiment, the hard mask is designed to have an opening above a defined area of the porous region that is smaller than the anodization area formed by the anodization hard mask. As such, the hard mask covers a portion or the entirety of a hard mask interface region of the porous region. This excludes lateral pores, whose shapes (i.e., diameter, depth, orthogonality to the substrate) are difficult to control, from serving to receive an embedded electrical structure. Thus, as an embedding structure, the residual functionally-active part of the porous region structure has an equivalent specific surface (i.e., the surface area provided by the pores of the porous region) that can be more precisely quantified. Consequently, a higher precision can be achieved for the electrical value (e.g., capacitance, resistance, etc.) of the electrical structure (e.g., capacitive, resistive, etc.) formed inside the porous region structure.

In an embodiment, a distance between an edge of the anodization area and a corresponding edge of the defined area of the porous region is proportional to a thickness of the section of the first metal layer that is anodized to form the porous region. This configuration is based on the inventors' insight that the width of the hard mask interface region increases with the thickness of the first metal layer being anodized. This configuration ensures that the lateral pores are substantially or fully covered by the hard mask. In one embodiment, the distance between the edge of the anodization area and the corresponding edge of the defined area ranges from 100 nanometers to 50 microns.

In an embodiment, the porous region structure may further comprise a layered structure deposited on top of the hard mask, the layered structure being embedded in the plurality of pores, not including the lateral pores, of the porous region. The layered structure may comprise a metal-insulator-metal (MIM) stack, resulting in the porous region structure providing a capacitive component.

In one implementation, a conductive layer of the layered structure, which may provide an electrode for the layered structure, may be deposited using an Atomic Layer Deposition (ALD) process with a gaseous halogen-based (e.g., chlorine) precursor. For example, the conductive layer may be made of titanium nitride (TiN). As discussed above, the first metal layer, which may be made of aluminum, may be prone to corrosion when exposed to this type of precursor, and exposure is most likely to be induced by the lateral pores of the porous region.

By having the hard mask interface region sealed by the hard mask, the porous region structure of the present invention is made compatible with a subsequent processes involving the use of a halogen-based precursor or processes that could cause corrosion to exposed areas of the first metal layer. In an embodiment, the hard mask is also made of a material that is substantially resistant to halogen corrosion to provide further protection against this type of corrosion.

In an embodiment, the porous region structure may further comprise a second metal layer below the first metal layer, with non-lateral pores of the porous region extending through the porous region to open onto the second metal layer. The second metal layer may serve to provide electrical contact to a structure deposited into the non-lateral pores of the porous region. For example, where a layered structure is deposited into the non-lateral pores, a conductive layer of the layered structure may be in electrical contact with the second metal through the non-lateral pores. The second metal layer may also be made of a metal that is resistant to halogen corrosion, thereby increasing the compatibility of the porous region structure with a subsequent process involving the use of a halogen-based precursor.

In an embodiment, the porous region structure may further comprise an electronic component, formed on the substrate, electrically connected to the second metal layer. A device formed within the porous region may thus be connected with another electrical component on the substrate, resulting in a functional module.

In an embodiment, the substrate may be made of silicon, glass, or a polymer. The substrate may be a raw substrate (i.e., unprocessed) or processed with other electronic components formed thereon.

In embodiments, the anodization hard mask may be partially or completely removed (e.g., using selective etching) prior to the deposition of the hard mask. This can have several benefits. For example, during the anodization, the anodization hard mask may crack at the edges of the porous region due to the expansion of the PAA. The removal of the anodization hard mask allows any cracked areas of the anodization hard mask to be removed, making for a better deposition of the hard mask. The resulting structure is improved both from a cosmetic as well as from a robustness point of view (potential for chipping of the anodization hard mask is reduced or eliminated in the case the anodization hard mask is removed entirely). Subsequent process steps (e.g., metallization or photo-resist spin coating) are also simplified by the removal of the anodization hard mask. Indeed, during the anodization, the edges of the anodization hard mask are pushed upwards by the expanding PAA. This creates a vertical topology that may reach several microns compared to the flat reference surface. The vertical topology also typically has a ledge toward the PAA side. This complicates subsequent process steps (including deposition of the hard mask) whenever the subsequent process steps need to cover the ledge such as to preserve for example the continuity of the deposited layer across the ledge. Removal of the anodization hard mask eliminates this vertical topology and the ledge, reducing the constraint in terms of step-coverage and the risk of having discontinuous layers.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A porous region structure, comprising:
   a substrate;
   a first metal layer above the substrate;
   a porous region constituted by an anodized section of the
      first metal layer, the porous region comprising an anodic oxide having a plurality of pores that extend from a top surface of the porous region toward the substrate; and a hard mask above the first metal layer and the porous region, the hard mask having an opening above a defined area of the porous region configured so that the hard mask covers lateral pores of the plurality of pores of the porous region.

2. The porous region structure of claim 1, further comprising:

an anodization hard mask on top of the first metal layer having an opening above an anodization area of the porous region, wherein a distance between an edge of the anodization area and a corresponding edge of the defined area is related to a thickness of the section of the first metal layer that is anodized to form the porous region.

3. The porous region structure of claim 2, wherein the distance ranges from 100 nanometers to 50 microns.

4. The porous region structure of claim 2, wherein the lateral pores fall within the anodization area but outside the defined area of the porous region.

5. The porous region structure of claim 1, further comprising:

a second metal layer below the first metal layer, wherein non-lateral pores of the plurality of pores extend through the porous region to open onto the second metal layer.

6. The porous region structure of claim 5, wherein the second metal layer is made of tungsten or titanium.

7. The porous region structure of claim 5, further comprising:

an electronic component, formed on the substrate, electrically connected to the second metal layer.

8. The porous region structure of claim 5, further comprising:

a layered structure deposited on top of the hard mask, the layered structure being embedded in the plurality of pores, not including the lateral pores, of the porous region.

9. The porous region structure of claim 8, wherein the layered structure comprises a conductive layer that is in electrical contact with the second metal layer through the non-lateral pores.

10. The porous region structure of claim 8, wherein the layered structure comprises a metal-insulator-metal (MIM) stack.

11. The porous region structure of claim 1, wherein the hard mask is made of tungsten or titanium.

12. The porous region structure of claim 1, wherein the substrate is made of silicon, glass, or a polymer.

13. The porous region structure of claim 1, wherein the substrate is a raw substrate.

14. A capacitive component comprising the porous region structure of claim 1.

15. A method of fabricating a porous region structure, comprising:

depositing a first metal layer above a substrate;

depositing an anodization hard mask on top of the first metal layer, the anodization hard mask having an opening above an anodization area of the first metal layer;

anodizing the first metal layer to form a porous region within the first metal layer, the porous region underlying the anodization area of the first metal layer;

depositing a hard mask on top of the porous region, the hard mask having an opening above a defined area of the porous region, the defined area being smaller than and comprised within the anodization area; and depositing a layered structure on top of the hard mask and the porous region, to embed the layered structure into the porous region over the defined area of the porous region.

16. The method of claim 15, further comprising:

selectively etching the anodization hard mask prior to depositing the hard mask.

* * * * *